United States Patent
Bradley et al.

(10) Patent No.: US 9,088,265 B2
(45) Date of Patent: Jul. 21, 2015

(54) BULK ACOUSTIC WAVE RESONATOR COMPRISING A BORON NITRIDE PIEZOELECTRIC LAYER

(71) Applicant: Avago Technologies General IP (Singapore) Pte. Ltd., Singapore (SG)

(72) Inventors: Paul Bradley, Los Altos, CA (US); John D. Larson, III, Palo Alto, CA (US); Kevin J. Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 171 days.

(21) Appl. No.: 13/896,562

(22) Filed: May 17, 2013

(65) Prior Publication Data
US 2014/0340172 A1 Nov. 20, 2014

(51) Int. Cl.
| H03H 9/15 | (2006.01) |
| H03H 9/17 | (2006.01) |
| H03H 3/04 | (2006.01) |
| H03H 9/02 | (2006.01) |
| H03H 9/13 | (2006.01) |

(52) U.S. Cl.
CPC .............. *H03H 9/173* (2013.01); *H03H 3/04* (2013.01); *H03H 9/02015* (2013.01); *H03H 9/132* (2013.01); *H03H 9/175* (2013.01); *H03H 2003/0407* (2013.01)

(58) Field of Classification Search
CPC ....... H03H 9/173; H03H 9/175; H03H 9/132; H03H 9/02015; H03H 9/02102; H03H 2003/0407; H03H 3/04
USPC .......... 333/186–192, 200; 310/322, 324, 334, 310/335
See application file for complete search history.

(56) References Cited

U.S. PATENT DOCUMENTS

| 5,587,620 | A | 12/1996 | Ruby et al. |
| 5,873,153 | A | 2/1999 | Ruby et al. |
| 6,107,721 | A | 8/2000 | Lakin |
| 6,384,697 | B1 | 5/2002 | Ruby |
| 6,507,983 | B1 | 1/2003 | Ruby et al. |
| 6,593,679 | B2 | 7/2003 | Higuchi et al. |
| 6,936,837 | B2 | 8/2005 | Yamada et al. |
| 6,963,257 | B2 * | 11/2005 | Ella et al. ........... 333/133 |
| 7,275,292 | B2 | 10/2007 | Ruby et al. |
| 7,280,007 | B2 | 10/2007 | Feng et al. |

(Continued)

FOREIGN PATENT DOCUMENTS

| EP | 0534252 | 6/1996 | |
| JP | 59-207811 | * 11/1984 | ............ 423/290 |
| JP | 11274883 | 10/1998 | |

OTHER PUBLICATIONS

Fang et al; "Microstructure and Piezoelectric Properties of c-BN Nano-films Deposited on Si by RF Sputtering for Piezoelectric Devices"; 2013 IEEE 5th International Nanoelectronics Conference (INEC), Jan. 2-4, 2013, pp. 49-51 with a 1 page IEEE Xplore abstract.*

(Continued)

*Primary Examiner* — Barbara Summons

(57) ABSTRACT

A bulk acoustic wave (BAW) resonator structure comprises: a first electrode disposed over a substrate; a piezoelectric layer disposed over the first electrode, the piezoelectric layer comprising boron nitride (BN); and a second electrode disposed over the first piezoelectric layer.

30 Claims, 4 Drawing Sheets

(56) References Cited

U.S. PATENT DOCUMENTS

| | | | |
|---|---|---|---|
| 7,358,831 | B2 | 4/2008 | Larson, III et al. |
| 7,388,454 | B2 | 6/2008 | Ruby et al. |
| 7,554,244 | B1 * | 6/2009 | Ballato .................. 310/320 |
| 7,579,759 | B2 | 8/2009 | Lee et al. |
| 7,629,865 | B2 | 12/2009 | Ruby |
| 7,758,979 | B2 | 7/2010 | Akiyama et al. |
| 8,248,185 | B2 | 8/2012 | Choy et al. |
| 8,436,516 | B2 | 5/2013 | Ruby et al. |
| 2007/0205850 | A1 | 9/2007 | Jamneala et al. |
| 2007/0228876 | A1 | 10/2007 | Sung |
| 2008/0197750 | A1 * | 8/2008 | Katardjiev et al. ........... 310/311 |
| 2010/0327994 | A1 | 12/2010 | Choy et al. |
| 2011/0180391 | A1 | 7/2011 | Larson, III et al. |

OTHER PUBLICATIONS

Ranjan et al "Strained Hexagonal ScN: A Material with Unusual Structural and Optical Properties," Physical Review Letters, Jun. 27, 2003, vol. 90, No. 25, The American Physical Society, USA.

Farrer et al., "Properties of hexagonal ScN versus wurtzite GaN and InN," Physical Review B, Nov. 20, 2002, vol. 66, No. 20, The American Physical Society, USA.

Constantin et al., "Composition-dependent structural properties in ScGaN alloy films: A combined experimental and theoretical study," Journal of Applied Physics, Dec. 16, 2005, vol. 98, No. 12, American Institute of Physics, USA.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010.

\* cited by examiner

BULK ACOUSTIC WAVE RESONATOR COMPRISING A BORON NITRIDE PIEZOELECTRIC LAYER

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. For example, BAW resonators include thin film bulk acoustic resonators (FBARs), which include resonator stacks formed over a substrate cavity, and solidly mounted resonators (SMRs), which include resonator stacks formed over an acoustic reflector (e.g., Bragg mirror). The BAW resonators may be used for electrical filters and voltage transformers, for example.

Generally, an acoustic resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the fitter eventually settles at some high temperature.

In order to prevent or reduce rising temperatures, a conventional filter may include a layer of oxide material within the piezoelectric layer of the acoustic stack. The oxide material has a positive temperature coefficient, which at least partially offsets the negative temperature coefficients of the metal electrodes and the piezoelectric material, respectively. For example, the oxide material may be placed in the center of the piezoelectric layer or at either end of the piezoelectric layer between the electrodes. However, the electromechanical coupling coefficient ($kt^2$) of the resonator is greatly compromised by the addition of oxide material to the piezoelectric layer. This is because the oxide material appears as a "dead" capacitor in series with the active piezoelectric material dielectric. Further, the oxide material may contaminate the piezoelectric material. For example, when the piezoelectric material is aluminum nitride (AlN), the oxide material causes the AlN to become a chemical compound that includes oxygen (e.g., $AlN_{(x)}O_{(y)}$), which is a non-piezoelectric material, thus further degrading the acoustic coupling coefficient.

What is needed, therefore, is a BAW resonator that overcomes at least the shortcomings of known BAW resonators described above.

SUMMARY

In accordance with a representative embodiment, a bulk acoustic wave (BAW) resonator structure, comprises: a first electrode disposed over a substrate; a piezoelectric layer disposed over the first electrode, the piezoelectric layer comprising boron nitride (BN); and a second electrode disposed over the first piezoelectric layer.

In accordance with another representative embodiment, a film bulk acoustic resonator (FBAR) structure comprises: a substrate defining a cavity; a first electrode disposed over the substrate, at least a portion of the first electrode being formed over the cavity in the substrate; a piezoelectric layer disposed over the first electrode, the piezoelectric layer comprising boron nitride (BN); and a second electrode disposed over the first piezoelectric layer.

In accordance with another representative embodiment, a solidly mounted resonator (SMR) structure comprises: a substrate; an acoustic reflector formed on the substrate, the acoustic reflector comprising a plurality of acoustic impedance layers, wherein at least two of the acoustic impedance layers have different acoustic impedances; a first electrode disposed over the acoustic reflector; a piezoelectric layer disposed over the first electrode, the piezoelectric layer comprising boron nitride (BN); and a second electrode disposed over the first piezoelectric layer.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
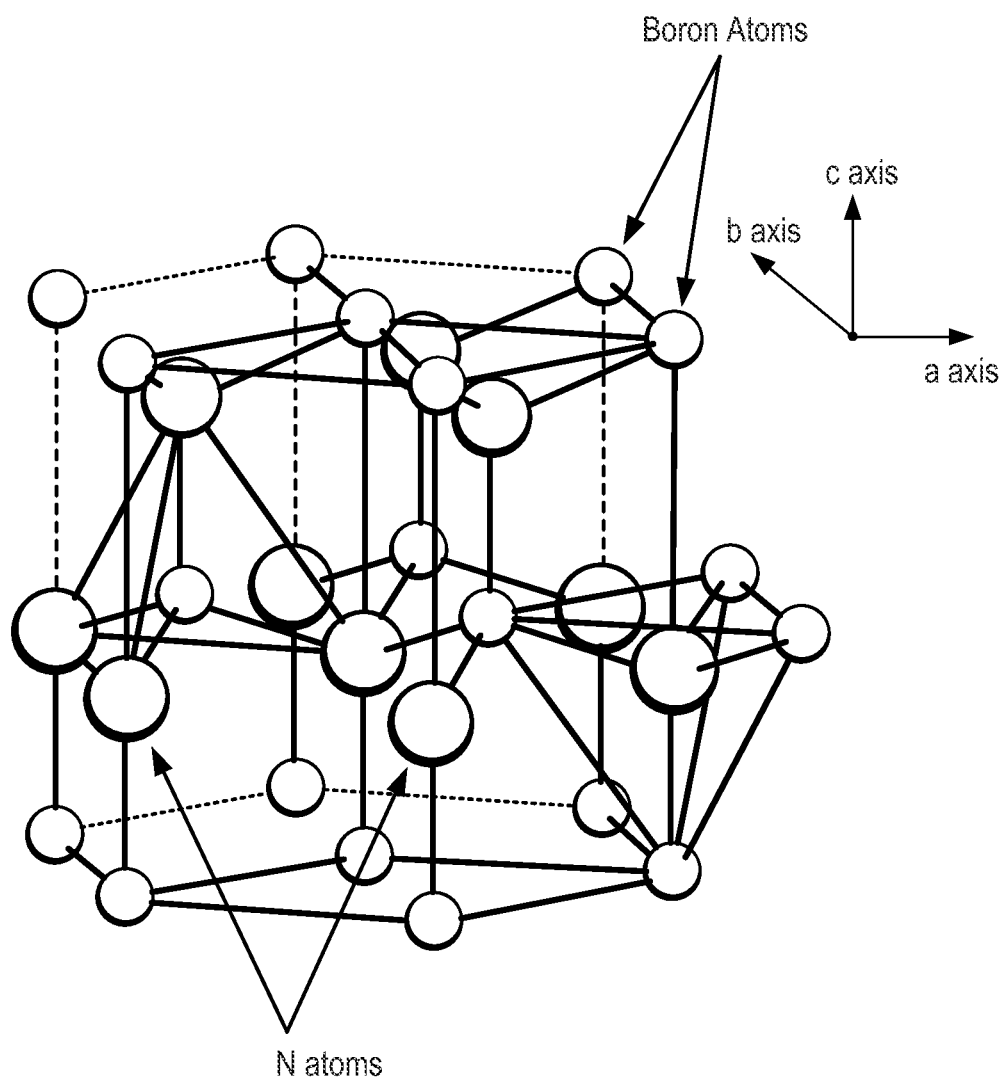
FIG. 1 is a perspective view of art illustrative model of a crystal structure of Boron Nitride (BN).

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator devices that may provide various filters (e.g., ladder filters), and other devices. Certain details BAW resonators, including FBARs, SMRs and resonator filters, materials thereof and their methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292, 7,388,454 and 7,629,865 to Ruby et al; U.S. Pat. No. 7,280,007 to Feng, et al.; U.S. Patent App. Pub. No. 20070205850 to Jamneala et al.; U.S. Pat. No. 8,248,185 to Choy et al.; and U.S. Patent App. Pub. No. 20100327994 to Choy et al. The entire contents of these patents and patent application publications are hereby incorporated by reference, it is emphasized that the components, materials and method of fabrication described in these patents and patent applications are representative and other methods of fabrication and materials within the purview of one of ordinary skill in the art are contemplated.

Various embodiments relate to providing BN thin film with an improvement in the negative temperature coefficients of the metal electrodes and the piezoelectric material, an enhanced piezoelectric coefficient d33 and an enhanced electromechanical coupling coefficient ($kt^2$) by incorporating multiple rare earth elements into the BN crystal lattice. By incorporating specific atomic percentages of the multiple rare earth elements, the piezoelectric properties of the BN, including piezoelectric coefficient d33 and enhanced electromechanical effective coupling coefficient ($kt^2$), are improved as compared to stoichiometric BN.

A BN thin film may be deposited with various specific crystal orientations, including a wurtzite (0001) B4 structure, which consists of a hexagonal crystal structure with alternating layers of Boron (B) and Nitrogen (N), and a zinc blend structure, which consists of a symmetric structure of B and N atoms, for example. FIG. 1 is a perspective view of an illustrative model of the common wurtzite structure. Due to the nature of the BN bonding in the wurtzite structure, electric field polarization is present in the BN crystal, resulting in the piezoelectric properties of the BN thin film. To exploit this polarization and the corresponding piezoelectric effect, one must synthesize the BN with a specific crystal orientation.

Referring to FIG. 1, the a-axis and the b-axis are in the plane of the hexagon at the top, while the c-axis is parallel to the sides of the crystal structure.

The RN wurtzite (001) B4 lattice structure provides an electromechanical coupling coefficient ($kt^2$) that is typically lower that the electromechanical coupling coefficient (kt2) of an Aluminum Nitride piezoelectric layer used in certain known BAW resonator devices. By way of example, the electromechanical coupling coefficient ($kt^2$) for undoped RN is approximately 2.0% to approximately 4.0%. Notably, in certain applications, it may be desirable to provide a piezoelectric material in the BAW resonator device that has a lower acoustic coupling coefficient compared to other more common piezoelectric materials (e.g., AlN) used in BAW resonator applications. For example, in filter applications that require a tower bandwidth than is often required in known fitters, and in filter applications that require a comparatively fast roll-off, providing the BN piezoelectric layer having a comparatively low electromechanical coupling coefficient ($kt^2$) in the acoustic stack of the BAW resonator device can be readily achieved. By way of example, RAW resonators of representative embodiments are contemplated for use in comparatively lower bandwidth applications such as Band 23 (S-Band 2 GHz) or Band 34 (TDD 2000 Europe). Additionally, BAW resonators of representative embodiments are contemplated for use in comparatively fast roll-off applications e.g., in Band 23 applications, which is only 10 MHz tower than the PCS Receiver band.

Certain properties of undoped BN piezoelectric material result in characteristics of BAW resonators that can be useful in certain applications. For example, as compared to AlN, undoped BN has a dielectric constant ($\in_r$) that is approximately one-half that of AlN. As such, BAW resonators that include BN piezoelectric layers have a greater areal dimension (e.g., x-y dimension in a Cartesian coordinate system) compared to BAW resonators that include AlN for piezoelectric layers. Moreover, the velocity of sound for RN is approximately 30% greater than the velocity of sound for AlN, so compared to BAW resonators having AlN as the piezoelectric layer, BN piezoelectric films are thicker (e.g., z-direction in a Cartesian coordinate system). As a result of the increased areal dimensions of the BAW resonators of representative embodiments that include BN piezoelectric layers, the RAW resonators of representative embodiments can have a higher operational frequency than known AlN BAW resonators. Moreover, due to the increased thickness of the BN piezoelectric layer of BAW resonators of representative embodiments, the electrostatic breakdown voltage of the BAW resonators of representative embodiments is greater than that of a known BAW resonator comprising an MN piezoelectric layer. Finally, due to the increase in size of the BAW resonators of representative embodiments, the power density is lower than a known BAW resonator comprising an MN piezoelectric layer having the same impedance.

Furthermore, the atomic bonds of B—N in the BN piezoelectric material of representative embodiments are stiffer compared to the Al—N bonds of known AlN piezoelectric materials. The stiffer atomic bonds in the lattice of the wurtzite BN piezoelectric material results in better intrinsic device linearity compared to a known BAW resonator having an AlN piezoelectric layer.

Finally, the BN piezoelectric material of representative embodiments has a lower bulk attenuation than known AlN piezoelectric materials, which ultimately results in an improved quality (Q) factor.

Additionally, it may be useful to provide an undoped or lightly doped (e.g., at the low end of the doping ranges described herein) BN piezoelectric layer in the acoustic stack of a BAW resonator structure because of its tower coefficient of thermal expansion ($C_{te}$) compared to that of AlN. Therefore, the thermal characteristics and power handling capabilities of the resultant BAW resonator structure is improved compared to known BAW resonators (comprising, for example, AlN piezoelectric layers) at least because the relatively low of the BN piezoelectric layer of the acoustic stack has lesser impact than the known piezoelectric materials used in BAW resonators such, the addition of a material (e.g., an oxide) having a positive $C_{te}$ to offset the negative temperature coefficients of the metal electrodes and the known piezoelectric material, respectively, that is incorporated into certain known acoustic stacks can be foregone. Beneficially, the deleterious impact of the material (e.g., an oxide) having a positive $C_{te}$ on the electromechanical coupling coefficient ($kt^2$) of the BAW resonator can be avoided through the use of BN as the piezoelectric layer in accordance with of the representative embodiments. Notably, in some embodiments the present teachings contemplate the inclusion of buried temperature compensation layer in the acoustic stack, such as described in commonly owned U.S. Pat. No. 8,436,516. However, because of the comparatively lower coefficient of thermal expansion ($C_{te}$) of the BN piezoelectric layer, the buried temperature compensation layer can be comparatively thin, and therefore does not have as significant of an impact on the electromechanical coupling coefficient ($kt^2$).

In many BAW resonator applications, however, a higher piezoelectric coefficient $d_{33}$ and a higher electromechanical coupling coefficient ($kt^2$) are desirable, since the higher the piezoelectric coefficient $d_{33}$, the less material is required to provide the same piezoelectric effect. Moreover, the piezoelectric coefficient $d_{33}$ and electromechanical coupling coefficient ($kt^2$) of BN are generally lower than other materials used for piezoelectric layers BAW resonators, such as AlN. In order to improve the value of the piezoelectric coefficient $d_{33}$, some of the Boron atoms may be replaced with a different metallic element, which may be referred to as "doping." Beneficially, by adding certain dopants to the BN crystal lattice, the lattice is perturbed and as a result the piezoelectric coefficient and the electromechanical coupling coefficient ($kt^2$) can be increased. Beneficially, by adding Aluminum to the BN crystal lattice, the piezoelectric properties of the BN piezoelectric material, including the piezoelectric coefficient and the electromechanical coupling coefficient ($kt^2$) can be increased compared to undoped BN piezoelectric material. For example, according to representative embodiments, the BN piezoelectric layer is doped with Aluminum in the range of approximately 0.0 atomic percent to approximately 40.0 atomic percent. In certain representative embodiments, a lower doping limit of approximately 1.0 atomic percent of Aluminum or other rare earth metal in the BN piezoelectric layer is contemplated. The use of Aluminum for the dopant in the BN crystal lattice is merely illustrative, and other materials are contemplated. For example, one or more of scandium (Sc), erbium (Er), and Yttrium (Yt), may be used as the doping elements. In a representative embodiment, the BN piezoelectric layer is doped with Scandium in the range of approximately 0.0 atomic percent to approximately 40.0 atomic percent. In certain representative embodiments, a lower doping limit of approximately 1.0 atomic percent of Scandium or other rare earth metal in the BN piezoelectric layer is contemplated.

More generally, the BN crystal lattice can be doped with one or more of the rare earth elements including, in addition to Scandium, Erbium or Yttrium, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of one or more rare earth elements, although specific examples are discussed below.

Figure 2A:
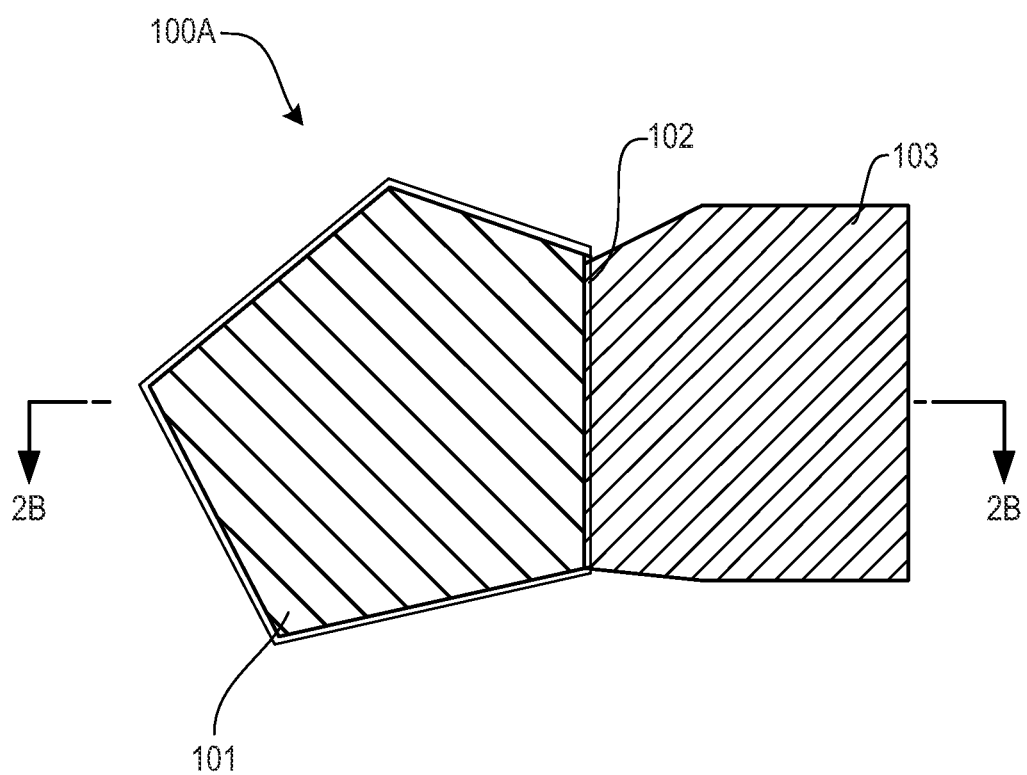
FIG. 2A shows a top-view of a thin film bulk acoustic resonator (FBAR) having doped piezoelectric layer, in accordance with a representative embodiment.

FIG. 2A shows a top view of FBAR 200 in accordance with a representative embodiment. The FBAR 200 includes a top electrode 101 having five (5) sides, with a connection side 102 configured to provide an electrical connection to interconnect 103. The interconnect 103 provides electrical signals to the top electrode 101 to excite desired acoustic waves in a piezoelectric layer (not shown in FIG. 2A) of the FBAR 200.

Figure 2B:
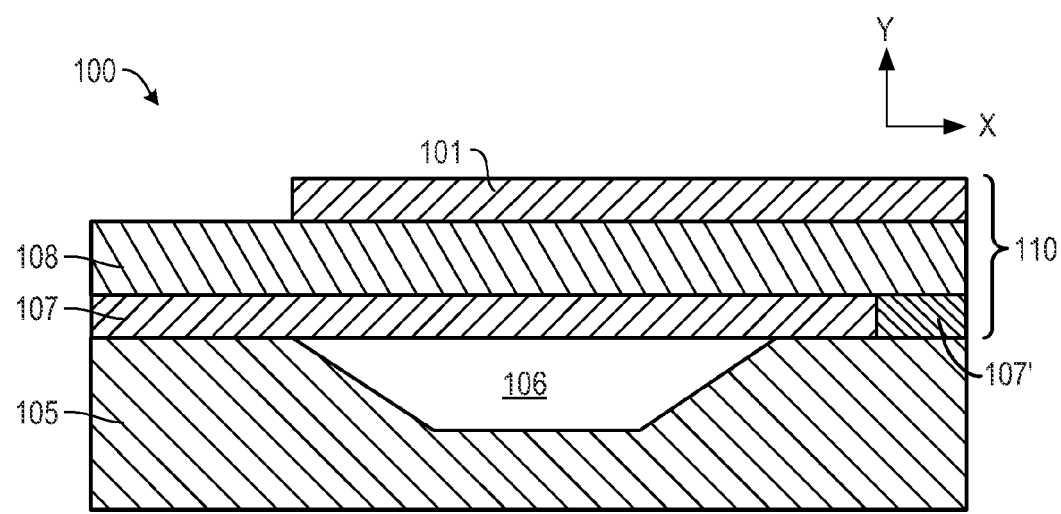
FIG. 2B is a cross-sectional view of the FBAR, taken along the line 2B-2B of FIG. 2A, having doped piezoelectric layer, in accordance with a representative embodiment.

FIG. 2B shows a cross-sectional view of the FBAR 200 taken along line 2B-2B in accordance with a representative embodiment. The FBAR 200 includes acoustic stack 110 formed of multiple layers over substrate 105 having a cavity 106. A first or bottom electrode 107 is disposed over the substrate 105, and extends over the cavity 106. A planarization layer 107' is also provided over the substrate as shown. In a representative embodiment, the planarization layer 107' includes non-etchable borosilicate glass (NEBSG), for example. In general, planarization layer 107' does not need to be present in the structure (as it increases overall processing cost), but when present, it may improve quality of growth of subsequent layers and simplify their processing. A piezoelectric layer 108 is disposed over the bottom electrode 107, and a second or top electrode 101 (shown in FIG. 2A) is disposed over the piezoelectric layer 108. As should be appreciated by one of ordinary skill in the art, the structure provided by the bottom electrode 107, the piezoelectric layer 108 and the top electrode 101 forms the acoustic stack 110 of a BAW resonator.

The substrate 105 may be formed of various types of materials, including semiconductor materials compatible with semiconductor processes, such as silicon (Si), gallium arsenide (GaAs), indium phosphide (InP), or the like, which is useful for integrating connections and electronics, thus reducing size and cost. Illustratively, the bottom electrode 107 and top electrode 101 are formed of tungsten (W) having a thickness of approximately 1000 Å to approximately 10000 Å. Other materials may be used for the bottom electrode 107 and the top electrode 101, including but not limited to molybdenum (Mo) or a bi-metal material. The cavity 106 may be formed using a sacrificial material, such as phosphosilicate glass (PSG), for example, which is subsequently released. The bottom electrode 107 may be applied to the top surface of the substrate 105 and the sacrificial material initially filling the cavity 115, and the top electrode 101 may be applied to the top surface of the piezoelectric layer 108, respectively, using a spin-on, sputtering, evaporation or chemical vapor disposition (CVD) technique, for example, to the desired thickness.

According to various embodiments, the piezoelectric layer 108 is formed of BN "doped" with at least one element, and has a thickness of approximately 5000 Å to approximately 25000 Å, for example. In particular, a number of Boron atoms of the piezoelectric layer 108 within the BN crystal lattice are replaced with at least one element (e.g., Al) at predetermined percentages, referred to as "doping element(s)." Because the doping elements replace only Boron atoms (e.g., of a Boron target or BN target), the percentage of nitrogen atoms in the piezoelectric layer 108 remains substantially the same regardless of the amount of doping. When percentages of doping elements are discussed herein, it is in reference to the total atoms (including nitrogen) of the piezoelectric layer 108. As noted above, the doping elements useful in improving the piezoelectric properties of the piezoelectric layer 108 include, but are not limited to Aluminum (Al), and rare earth elements scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of one or more of these doping elements, although specific examples are discussed below.

Figure 3:
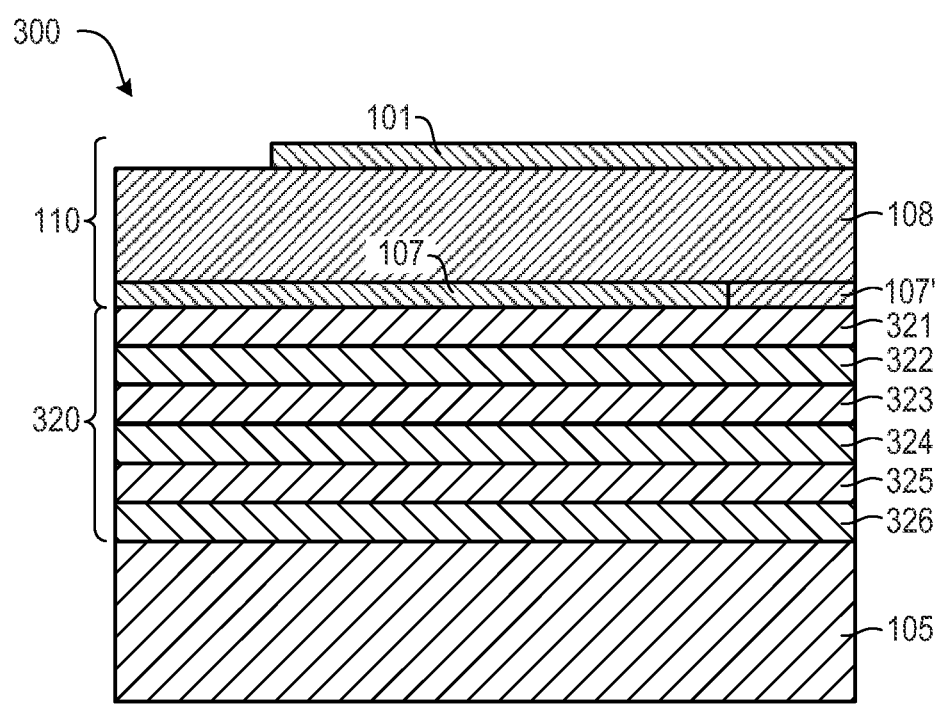
FIG. 3 is a cross-sectional view of a solidly mounted resonator (SMR) having doped piezoelectric layer, in accordance with a representative embodiment.

FIG. 3 shows a cross-sectional view of the SMR 300 in accordance with a representative embodiment. The various elements of the SMR 300 are substantially the same as the corresponding elements discussed above with reference to the FBAR 200 in FIG. 2B, except that the SMR 300 includes acoustic reflector 320 formed over the substrate 105 to provide acoustic isolation in place of the cavity 106. The acoustic reflector 320 may be a distributed Bragg reflector (DBR) or other acoustic mirror, for example, formed of multiple acoustic impedance layers, indicated by representative first through sixth acoustic impedance layers 321 to 326. The first or bottom electrode 107 and the planarization layer 107' are disposed over the acoustic reflector 320, the piezoelectric layer 108 is disposed over the bottom electrode 107, and the second or top electrode 101 is disposed over the piezoelectric layer 108. As should be appreciated by one of ordinary skill in the art, the structure provided by the bottom electrode 107, the piezoelectric layer 108 and the top electrode 101 forms the acoustic stack 110 of a BAW resonator.

More particularly, the acoustic reflector 320 is grown on the top of the substrate 105 and provides acoustic isolation between the substrate 105 and the acoustic stack 110. The first through sixth acoustic impedance layers 321 to 326 of the acoustic reflector 320 are formed of materials having different acoustic impedances. For example, the first through sixth acoustic impedance layers 321 to 326 may have alternating low and high acoustic impedances, such that acoustic impedance layer 321 has relatively low acoustic impedance, acoustic impedance layer 322 has relatively high acoustic impedance, acoustic impedance layer 323 has relatively tow acoustic impedance, acoustic impedance layer 324 has relatively high acoustic impedance, acoustic impedance layer 325 has relatively low acoustic impedance, and acoustic impedance layer 326 has relatively high acoustic impedance. These differing acoustic impedances can be obtained, for instance, by forming the odd numbered acoustic impedance layers 321, 323 and 325 of a relatively soft material, and forming the even numbered acoustic impedance layers 322, 324 and 326 of a relatively hard material. Notably, the number of acoustic impedance layers may differ from six, without departing from the scope of the present teachings Generally, the number of acoustic impedance layers may be determined by a tradeoff between desired mirror performance (e.g., the more layers the better) and cost and processing issues (e.g., the fewer layers the cheaper and more straightforward mirror growth and post-processing).

The amount of acoustic isolation provided by acoustic reflector 320 generally depends on the contrast between the acoustic impedances of adjacent acoustic impedance layers 321 to 326, with a greater amount of contrast creating better acoustic isolation. In some embodiments, the acoustic reflector 320 is formed in pairs of dielectric materials having contrasting acoustic impedances. For example, the odd numbered acoustic impedance layers 321, 323 and 325 may be formed of a material having low acoustic impedance, such as silicon oxide ($SiO_x$), where x is an integer, while the even numbered acoustic impedance layers 322, 324 and 326, paired with corresponding odd numbered acoustic impedance layers 321, 323 and 325, may be formed of a material having high acoustic impedance, such as tungsten (W) or molybdenum (Mo). In another example, the odd numbered acoustic impedance layers 321, 323 and 325 may be formed of carbon-doped silicon oxide (CDO), while the even numbered acoustic impedance layers 322, 324 and 326, paired with corresponding odd numbered acoustic impedance layers 321, 323 and 325, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 320 and SMR 300 may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 320 may vary without departing from the scope of the present teachings. The present teachings contemplate the use of FBARs (e.g., FBAR 200) or SMRs (e.g. SMR 300) in a variety of applications, including filters (e.g., ladder filters comprising a plurality of RAW resonators).

In accordance with a representative embodiment, the piezoelectric layer 108 in FIGS. 2B and 3 may be formed of undoped BN. Alternatively, in accordance with another representative embodiment, the piezoelectric layer 108 may be formed of BN doped with Aluminum (Al), or Scandium (Sc), or Yttrium (Yt), or Erbium (Er), or a combination of two or more of these doping elements.

In fabrication of piezoelectric layer 108 comprising undoped BN, Boron may be sputtered onto a known seed layer grown over or on a top surface of the bottom electrode 120, or sputtered directly on the top surface of the bottom electrode 120, in the presence of an argon (Ar)-nitrogen ($N_2$) gas atmosphere inside a reaction chamber. More particularly, in various embodiments, a target of Boron and a target of Aluminum are provided in a reaction chamber. Alternatively, a composite target formed of BN is provided in the reaction chamber.

Application of AC power creates Ar—$N_2$ plasma with which the target(s) reacts, and results in sputter deposition of Boron and Nitrogen in proportionate amounts to the seed layer (or to the top surface of the bottom electrode 120). The top surface of the bottom electrode 120 may be previously cleaned using Ar and/or hydrogen (H$_2$) gas. Examples of general sputter deposition processes are provided by U.S. Patent App. Pub. No. 2011/0180391 to Larson, III et al., published on Jul. 28, 2011 which is hereby incorporated by reference in its entirety.

As noted above, in other representative embodiments, the piezoelectric layer 108 may be formed of BN doped with Aluminum (Al), or rare earth metals (e.g., Scandium (Sc), or Yttrium (Yt), or Erbium (Er)), or a combination of two or more of these doping elements.

In a representative embodiment, doped BN is formed using a composite target, such as a Boron target or a BN target, that includes the desired proportion of Aluminum or the desired proportions of rare earth metal (e.g., Scandium or Yttrium), or both.

In another representative embodiment, doped BN is formed using a composite target formed of substantially of Boron, with the doping elements (e.g., Aluminum, or Scandium, or both) introduced by forming holes in the Boron target or BN target and inserting "plugs" of Aluminum and/or rare earth metal into the respective holes in the desired proportions. In still another representative embodiment, multiple targets may be used. For example, a Boron target or a BN target, and an Aluminum target may be provided in the reaction chamber. The percentage of each of the doping elements used to form doped BN piezoelectric materials for use as piezoelectric layer 108 of representative embodiments corresponds to the collective volume of that element inserted into one or more respective holes, which displaces a corresponding volume of Boron. The size and number of holes, as well as the amount of the doping element filling each of the holes, may be determined on a case-by-case basis, depending on the desired percentages of the doping elements. For example, the holes may be drilled partially or entirely through the Boron target in the desired sizes and numbers in various patterns. Similarly, in alternative embodiments, the rare earth elements may be added to the Boron target in the desired proportions using various alternative types of insertions, without departing from the scope of the present teachings. For example, full or partial rings formed of the elements, respectively, may be inlaid in each Boron target. The number, width, depth and circumference of each ring may be adjusted to provide the desired proportion of each particular element.

In still other representative embodiments, the Boron and doping element(s) may be sputtered onto the seed layer grown on the top surface of the bottom electrode 120, or sputtered directly on the top surface of the bottom electrode 120, using multiple targets formed of the different elements, respectively. For example, a Boron or BN target and an Aluminum target may be provided in the reaction chamber, or an alloy may be applied using a Boron target or a BN target, an Aluminum target and a rare earth metal target (e.g., a scandium target) separately reacting to the Ar—N$_2$ plasma. The desired proportions of the elements (e.g., the Boron and the doping element(s)) may be obtained by varying the AC power applied to each of the targets and/or the sizes of the targets in relation to one another. Of course, any other process for applying doping elements in desired proportions to form a doped piezoelectric BN layer may be used without departing from the scope of the present teachings.

Generally, the Boron and Nitrogen are proportioned at approximately 50 percent each (i.e., the overall atomic percentage of the Boron is approximately 50). As mentioned above, the Aluminum, or rare earth metal(s), or a combination thereof replace Boron atoms (in the BN crystal lattice), while the proportionate amount of nitrogen stays substantially the same. So, for example, a Boron target or a BN target may contain about 5 percent Aluminum, or 5 percent Scandium, in which case the Boron in the piezoelectric layer 108 has an atomic percentage of approximately 45, while the Aluminum dopant or the Scandium dopant in the piezoelectric layer 108 has an atomic percentage of approximately 5. The atomic consistency of the piezoelectric layer 108 may then be represented as $B_{0.45}N_{0.50}Al_{0.05}$, or $B_{0.45}N_{0.50}Sc_{0.05}$ for example.

In various embodiments, the amount of Aluminum dopant present in the piezoelectric layer 108 is approximately 0 atomic percent to approximately 40 atomic percent, for example. In other embodiments the amount of Scandium dopants, or Yttrium dopants present in the piezoelectric layer 108 is approximately 0 atomic percent to approximately 40 atomic percent, for example. In certain representative embodiments, a lower doping limit of approximately 1.0 atomic percent of Scandium or other rare earth metal in the BN piezoelectric layer is contemplated. Notably, significant improvement in electromechanical coupling coefficient (kt$^2$) is anticipated in embodiments of BAW resonators. Also, although described with specific reference to a piezoelectric layer 108 formed of BN doped with Scandium or Yttrium, or Erbium, it is emphasized that the piezoelectric layer 108 may be doped with two or more other rare earth elements in substantially the same manner, with or without Aluminum dopants, without departing from the scope of the present teachings. For example, the piezoelectric layer 108 may be formed of doped BN, using an Al—Sc—Y alloy, an Al—Er—Y alloy or an Al—Sc—Er—Y alloy, where each of the doping elements has an atomic percentage less than about 10.

In alternative embodiments, BN piezoelectric layers doped with Aluminum, or rare earth metals, or combinations thereof may be formed in acoustic resonator stacks of various other types of resonator devices, without departing from the scope of the present teachings. For example, a piezoelectric layer doped with two or more rare earth elements may be formed in resonator stacks of a stacked bulk acoustic resonator (SBAR) device, a double bulk acoustic resonator (DBAR) device, or a coupled resonator filter (CRF) device.

In accordance with illustrative embodiments, BAW resonator structures comprising piezoelectric layers formed of materials alloyed with multiple rare earth elements are described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (RAW) resonator structure, comprising:
   a first electrode disposed over a substrate;
   a piezoelectric layer disposed over the first electrode, the piezoelectric layer comprising boron nitride (BN) comprising a wurtzite structure; and
   a second electrode disposed over the piezoelectric layer.

2. The BAW resonator according to claim 1, wherein the piezoelectric layer is doped with at least one element.

3. The RAW resonator according to claim 2, wherein the at least one element comprises Aluminum (Al).

4. The BAW resonator according to claim 3, wherein the at least one element is incorporated into a crystal lattice of the RN piezoelectric material.

5. The RAW resonator according to claim 3, wherein a concentration of the Aluminum is in the range of approximately 0.0 weight percent to approximately 40 weight percent of the piezoelectric material.

6. The RAW resonator according to claim 2, wherein the at least one element comprises Erbium (Er).

7. The RAW resonator according to claim 2, wherein the at least one element comprises Scandium (Sc).

8. The RAW resonator according to claim 7, wherein a concentration of the Scandium is in the range of approximately 1.0 atomic percent to approximately 40.0 atomic percent of the piezoelectric material.

9. The BAW resonator according to claim 2, wherein the piezoelectric layer is provided using a plurality of targets formed of Boron and the at least one doping element, respectively, and sputtering the Boron and the at least one doping element from the corresponding targets over the bottom electrode using a plasma comprising nitrogen.

10. The RAW resonator according to claim 1, wherein the piezoelectric layer is provided using a target formed of a compound comprising Boron and Nitrogen, and sputtering the Boron and Nitrogen from the target over the bottom electrode using a plasma.

11. The BAW resonator structure according to claim 1, wherein the wurtzite structure is a wurtzite (0001) B4 structure, comprising: a hexagonal crystal structure with alternating layers of Boron (B) and Nitrogen (N); or a zinc blend structure comprising a symmetric structure of boron (B) and nitrogen (N) atoms.

12. A film bulk acoustic resonator (FBAR) structure, comprising:
a substrate defining a cavity;
a first electrode disposed over the substrate, at least a portion of the first electrode being formed over the cavity in the substrate;
a piezoelectric layer disposed over the first electrode, the piezoelectric layer comprising boron nitride (RN) comprising a wurtzite structure; and
a second electrode disposed over the piezoelectric layer.

13. The FBAR structure according to claim 12, wherein the piezoelectric layer is doped with at least one element.

14. The FBAR structure according to claim 13, wherein the at least one element comprises Aluminum (Al).

15. The FBAR structure according to claim 14, wherein the at least one element is incorporated into a crystal lattice of the RN piezoelectric material.

16. The FBAR structure according to claim 13, wherein the at least one element comprises Scandium (Sc).

17. The FBAR structure according to claim 13, wherein the at least one element comprises Erbium (Er).

18. The FBAR structure according to claim 12, wherein the wurtzite structure is a wurtzite (0001) B4 structure, comprising: a hexagonal crystal structure with alternating layers of Boron (B) and Nitrogen (N), and a zinc blend structure comprising a symmetric structure of boron (B) and nitrogen (N) atoms.

19. A solidly mounted resonator (SMR) structure, comprising:
a substrate;
an acoustic reflector formed on the substrate, the acoustic reflector comprising a plurality of acoustic impedance layers, wherein at least two of the acoustic impedance layers have different acoustic impedances;
a first electrode disposed over the acoustic reflector;
a piezoelectric layer disposed over the first electrode, the piezoelectric layer comprising boron nitride (BN) comprising a wurtzite structure; and
a second electrode disposed over the piezoelectric layer.

20. The SMR structure according to claim 19, wherein the acoustic reflector comprises a distributed Bragg reflector (DBR).

21. The SMR structure according to claim 19, wherein the piezoelectric layer is doped with at least one element.

22. The SMR structure according to claim 21, wherein the at least one element comprises Aluminum (Al).

23. The SMR structure according to claim 21, wherein the at least one element comprises Scandium (Sc).

24. The SMR structure according to claim 19, wherein the wurtzite structure is a wurtzite (0001) B4 structure, comprising: a hexagonal crystal structure with alternating layers of Boron (B) and Nitrogen (N), and a zinc blend structure comprising a symmetric structure of boron (B) and nitrogen (N) atoms.

25. A bulk acoustic wave (BAW) resonator structure, comprising:
a first electrode disposed over a substrate;
a piezoelectric layer disposed over the first electrode, the piezoelectric layer comprising boron nitride (BN), wherein the piezoelectric layer is doped with at least one of Scandium Sc) or Erbium (Er); and
a second electrode, disposed over the piezoelectric layer.

26. The RAW resonator structure according to claim 25, comprising a film bulk acoustic resonator (FBAR), the FBAR comprising: the substrate defining a cavity, wherein the first electrode is disposed over the substrate, at least a portion of the first electrode being formed over the cavity in the substrate.

27. The RAW resonator structure according to claim 25, comprising a solidly mounted resonator (SMR), the SMR comprising: the substrate; an acoustic reflector formed in or on the substrate, the acoustic reflector comprising a plurality of acoustic impedance layers, wherein at least two of the acoustic impedance layers have different acoustic impedances.

28. The BAW resonator according to claim 25, wherein a concentration of the Scandium is in the range of approximately 1.0 atomic percent to approximately 40.0 atomic percent of the piezoelectric material.

29. The RAW resonator according to claim 25, wherein the piezoelectric layer is provided using a target formed of a compound comprising Boron and Nitrogen, and sputtering the Boron and Nitrogen from the target over the bottom electrode using a plasma.

30. The BAW resonator according to claim 25, wherein the piezoelectric layer is provided using a plurality of targets formed of Boron and the at least one doping element, respectively, and sputtering the Boron and the at least one doping element from the corresponding targets over the bottom electrode using a plasma comprising nitrogen.

* * * * *